(12) United States Patent
Shiraishi et al.

(10) Patent No.: US 7,850,344 B2
(45) Date of Patent: Dec. 14, 2010

(54) LIGHT EMITTING DEVICE HOUSING AND A MANUFACTURING METHOD THEREOF, AND LIGHT EMITTING APPARATUS USING THE SAME

(75) Inventors: Akinori Shiraishi, Nagano (JP); Kei Murayama, Nagano (JP); Yuichi Taguchi, Nagano (JP); Masahiro Sunohara, Nagano (JP); Mitsutoshi Higashi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 196 days.

(21) Appl. No.: 11/773,155

(22) Filed: Jul. 3, 2007

(65) Prior Publication Data

US 2008/0123344 A1 May 29, 2008

(30) Foreign Application Priority Data

Jul. 4, 2006 (JP) .............................. 2006-184860

(51) Int. Cl.
*F21V 7/00* (2006.01)

(52) U.S. Cl. ...................... 362/298; 362/247; 362/346; 362/800

(58) Field of Classification Search ................. 362/247, 362/297, 298, 346, 800; 257/98, 99, 100
See application file for complete search history.

(56) References Cited

U.S. PATENT DOCUMENTS

| 7,429,759 | B2 * | 9/2008 | Isokawa ...................... 257/100 |
| 7,518,155 | B2 * | 4/2009 | Ishidu et al. .................. 257/98 |
| 2006/0193121 | A1 * | 8/2006 | Kamoshita .................. 362/800 |
| 2007/0001187 | A1 * | 1/2007 | Kim ............................ 257/98 |
| 2008/0186712 | A1 * | 8/2008 | Chen ........................... 362/297 |

FOREIGN PATENT DOCUMENTS

JP        2004-281992        10/2004

* cited by examiner

*Primary Examiner*—Y My Quach Lee
(74) *Attorney, Agent, or Firm*—Rankin, Hill & Clark LLP

(57) ABSTRACT

A light emitting device housing having a concave part is provided therein for housing a light emitting device. Side surfaces of the concave part are each configured to be a perpendicular surface that is substantially perpendicular to a bottom surface of the concave part, and other side surfaces are each configured to be an inclined surface for reflecting light from the light emitting device toward above the light emitting device.

9 Claims, 12 Drawing Sheets

LIGHT EMITTING DEVICE HOUSING AND A MANUFACTURING METHOD THEREOF, AND LIGHT EMITTING APPARATUS USING THE SAME

This application claims foreign priority based on Japanese Patent application No. 2006-184860, filed on Jul. 4th, 2006, the contents of which is incorporated herein by reference in its entirety.

BACKGROUND OF THE INVENTION

1. Field of the Invention

The present invention relates to a light emitting device housing and a manufacturing method thereof, and a light emitting apparatus. More specifically, it relates to a light emitting device housing including a concave part where a light emitting device is provided therein, manufacturing methods thereof, and a light emitting apparatus.

2. Description of the Related Art

FIG. 1 is a cross sectional view of a conventional light emitting apparatus. FIG. 2 is a plan view of the light emitting apparatus shown in FIG. 1.

With reference to FIGS. 1 and 2, a conventional light emitting apparatus 100 has a wiring substrate 101, a light emitting apparatus 102, and a metal frame 103. The wiring substrate 101 has a main substrate 105, a wiring 106, through vias 107 and 108, and external connection terminals 111 and 112.

The main substrate 105 is shaped in a plate form, and has through holes 114A and 114B. The wiring 106 is provided on the top side 105A of the main substrate 105. The through via 107 is provided in the through hole 114A, and is connected to the wiring 106. The through via 108 is provided in the through hole 114B.

The external connection terminal 111 is provided on the back surface 105B of the main substrate 105. The external connection terminal 111 is connected with the through via 107. The external connection terminal 112 is provided on the back surface 105B of the main substrate 105. The external connection terminal 112 is connected with the through via 108.

The light emitting device 102 is provided on the wiring 106. The light emitting device 102 has power supply terminals 117 and 118. The power supply terminal 117 is connected with the wiring 106, while the power supply terminal 118 is electrically connected with the through via 108 by a wire 119.

The metal frame 103 is provided on the top side 105A of the main substrate 105. The metal frame 103 has an inner opening 121, and an inclined surface 122 forming the side surface of the inner opening 121. The inner opening 121 is formed in a taper shape such as to increase in width from the back surface 103A side of the metal frame 103 toward the top side 103B side thereof. The inclined surface 122 is functioning as a reflector to reflect the light emitted from the light emitting device 102 to a lens (not shown) which is disposed over the light emitting apparatus 100. Provision of such an inclined surface 122 can improve the luminous efficiency of the light emitting apparatus 100 such as known in JP-A-2004-281992.

However, although the conventional light emitting apparatus 100 can be improved in luminous efficiency, it is hardly avoidable that the light emitted upwardly from the light emitting apparatus 100 would eventually diffuses. In this regard, it is not an appropriate application to use the light emitted from the light emitting apparatus 100 as a point light source. As for the light emitting apparatus serving as a point light source, they can be applied for a spotlight, a headlight of a vehicle, and so on.

SUMMARY OF THE INVENTION

Under such circumstances, it is an object of the present invention to provide a light emitting device housing capable of improving the luminous efficiency, and capable of suppressing the diffusion of light emitted upwardly from the light emitting device, and a manufacturing method thereof, and a method for manufacturing a light emitting apparatus.

In accordance with one of the aspects of the present invention, there is provided a light emitting device housing including a concave part where a light emitting device is provided therein, characterized in that the concave part has a plurality of side surfaces, at least one side surface among the plurality of the side surfaces is configured to be substantially perpendicular to the bottom surface of the concave part, and other side surfaces in said plurality of the side surfaces, in other words, other than those being configured as the perpendicular surface, are configured to be inclined surfaces to reflect the light from the light emitting device upwardly.

In accordance with the invention, tanks for said at least one side surface that is substantially perpendicular to the bottom surface of the concave part, and the side surfaces having such inclined surfaces reflecting light from the light emitting device toward above the light emitting device, is the present invention makes it possible to improve the luminous efficiency by suppressing the diffusion of light emitted upwardly from the light emitting device housing.

In accordance with another aspect of the invention, there is provided a method for manufacturing a light emitting device housing including a concave part provided where a light emitting device is mounted therein, said methods comprising the steps of: a silicon substrate preparation step of preparing a silicon substrate of which principal surface is a <100> plane, a resist film formation step of forming a resist film on the principal surface of the silicon substrate, said resist film including an opening in a quadrangular shape in plan view, and a concave part formation step of etching the silicon substrate to form the concave part by wet etching using the resist film as a mask, characterized in that forming the opening is performed in a way such that any one pair of the opposing two sides of the opening is aligned to have an angle of 45 degrees with respect to the <110> plane of the silicon substrate.

In accordance with the invention, tanks for a resist film formed on the silicon substrate with a quadrangular shape opening of which one pair of the opposing two sides is aligned to have an angle of 45 degrees with respect to the <110> plane of the silicon substrate, it is possible to readily form the concave part which has the side surfaces of the concave part made substantially perpendicular to the bottom surface of the concave part, and the side surfaces of the concave part each configured to be an inclined surface so as to reflect the light emitted from the light emitting device upwardly.

In accordance with the present invention, it is possible to improve the luminous efficiency of a light emitting apparatus, and it is possible to suppress the diffusion of light emitted upwardly from a light emitting device.

DESCRIPTION OF THE PREFERRED EMBODIMENTS

Embodiments of the present invention will be described herein below by reference to the drawings. Unless otherwise specifically defined in the specification, terms have their ordinary meaning as would be understood by those of ordinary skill in the art.

First Embodiment

Figure 1:
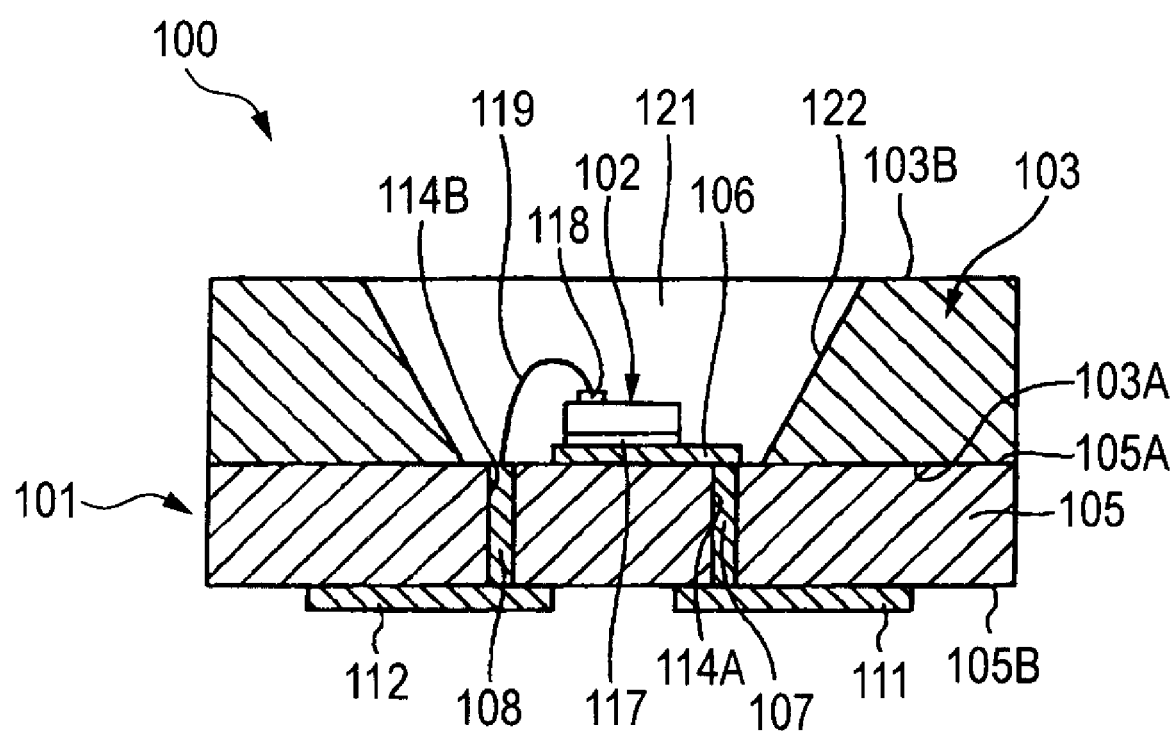
FIG. 1 shows a cross sectional view of a conventional light emitting apparatus.
Figure 2:
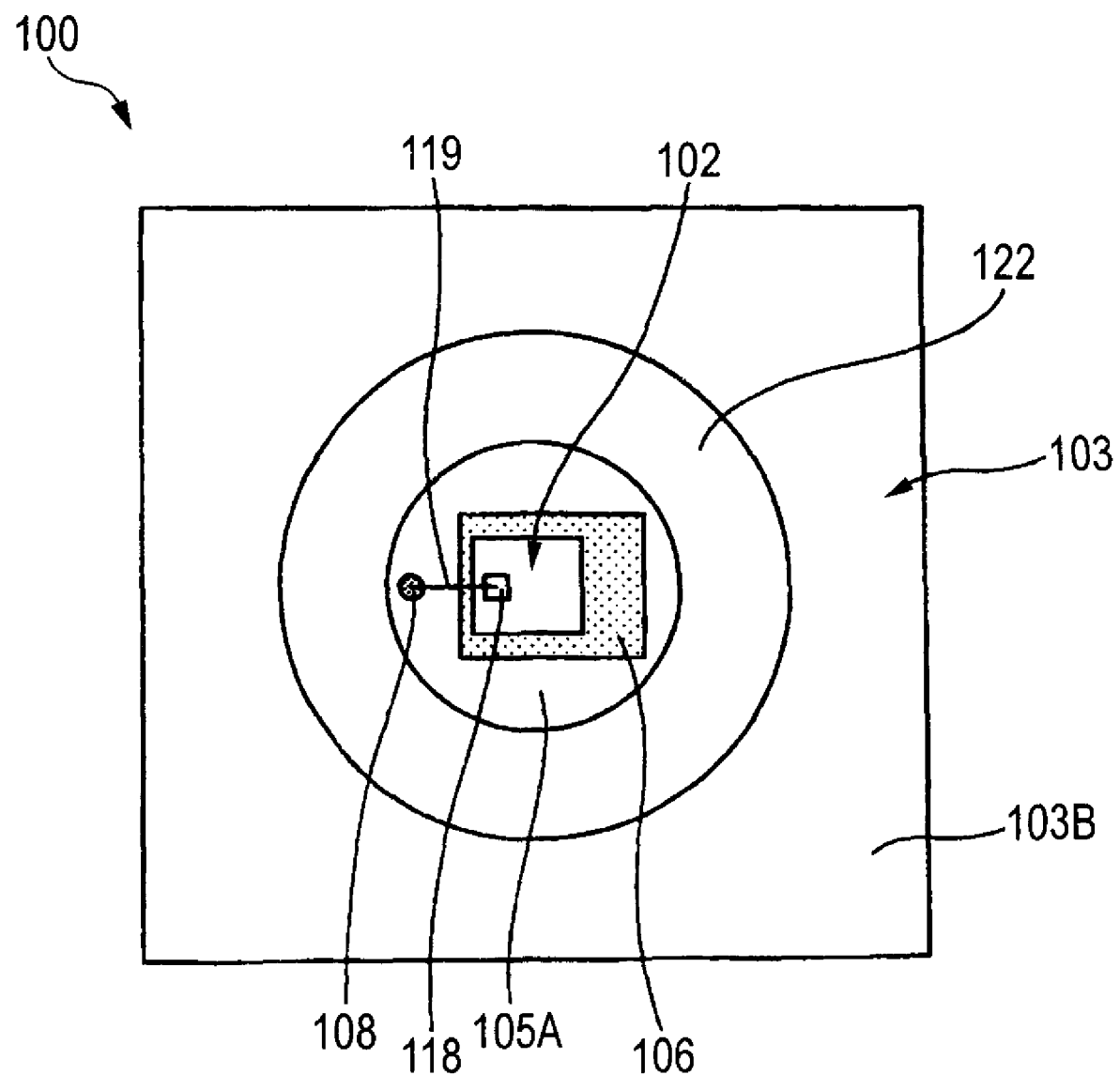
FIG. 2 shows a plan view of the light emitting apparatus shown in FIG. 1.
Figure 3:
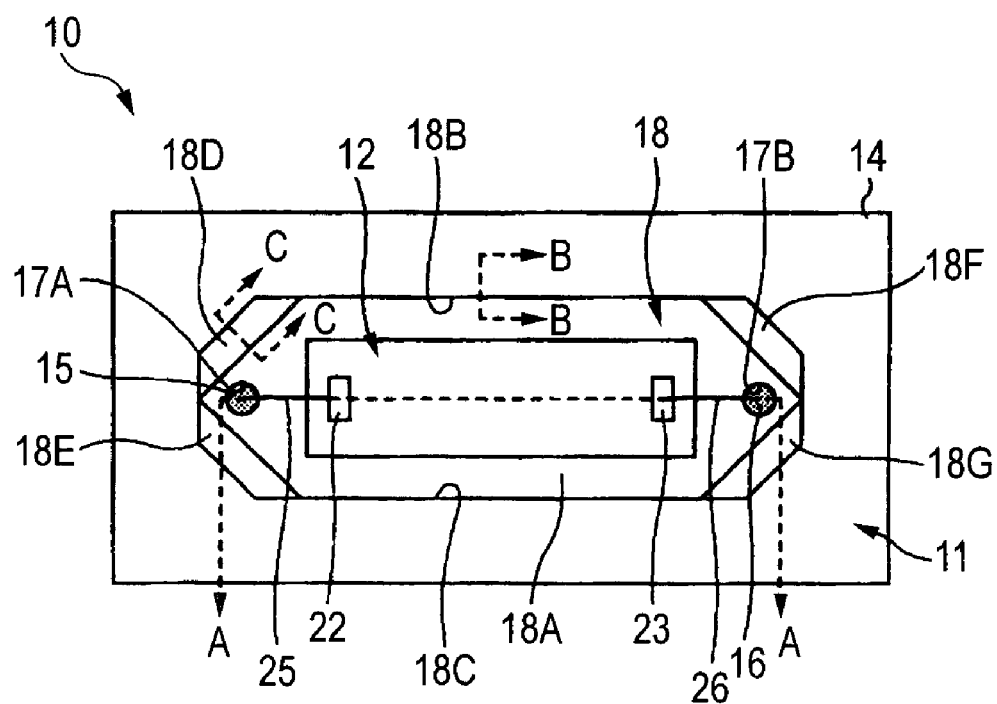
FIG. 3 shows a plan view of a light emitting apparatus in accordance with a first embodiment of the invention.
Figure 4:
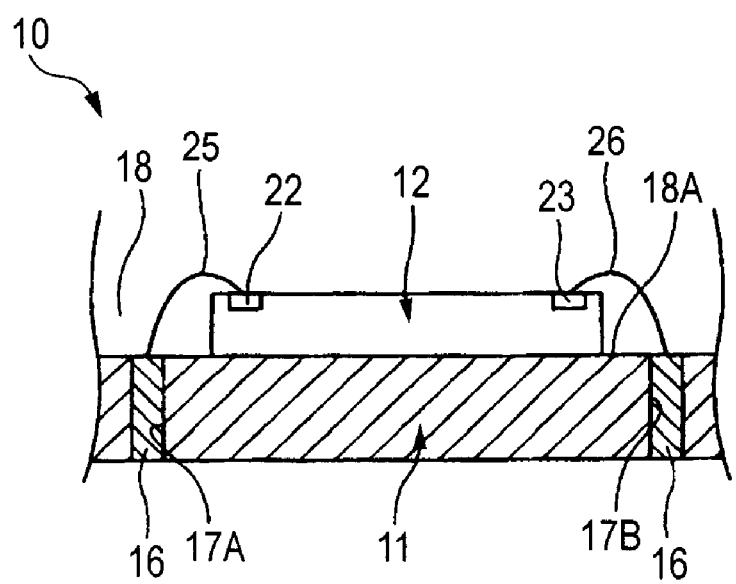
FIG. 4 shows a cross sectional view along line A-A of the light emitting apparatus shown in FIG. 3.

FIG. 3 is a plan view of a light emitting apparatus in accordance with a first embodiment of the invention. FIG. 4 is a cross sectional view along line A-A of the light emitting apparatus shown in FIG. 3.

With reference to FIGS. 3 and 4, a light emitting apparatus 10 of the first embodiment has a light emitting device housing 11 and a light emitting device 12.

The light emitting device housing 11 has a housing main body 14 and via electrodes 15 and 16. The housing main body 14 is for housing the light emitting device 12. As the material for the housing main body 14, for example, silicon can be used. The housing main body 14 has through holes 17A and 17B, and a concave part 18.

The through holes 17A and 17B are formed so as to penetrate through the housing main body 14.

The concave part 18 is for housing the light emitting device 12, and has six side surfaces 18B to 18G (a plurality of side surfaces). The side surfaces 18B and 18C of the concave part 18 are provided so as to face any one of two long sides of the four sides of the light emitting device 12 which is a rectangle in plan configuration.

Figure 5:
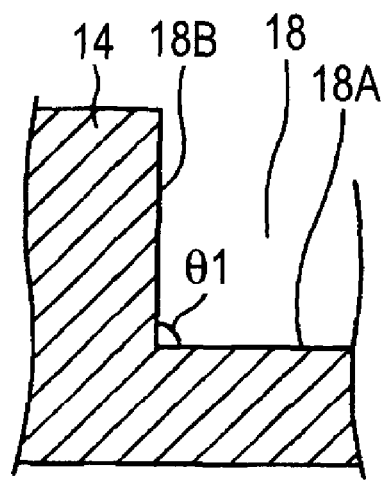
FIG. 5 shows a cross sectional view along line B-B of the light emitting apparatus shown in FIG. 3.

FIG. 5 is a cross sectional view along line B-B of the light emitting apparatus shown in FIG. 3. In FIG. 5, the same constitutional elements as those of the light emitting apparatus 10 shown in FIG. 3 are given the same reference numerals and signs.

By reference to FIG. 5, the side surface 18B of the concave part 18 is configured to have a perpendicular surface substantially perpendicular to the bottom surface 18A of the concave part 18. The angle θ1 formed between the side surface 18B and the bottom surface 18A of the concave part 18 is set to be substantially 90 degrees. Whereas, the side surface 18C of the concave part 18 is configured to have a perpendicular surface substantially perpendicular to the bottom surface 18A of the concave part 18. The angle formed between the side surface 18C and the bottom surface 18A of the concave part 18 is set to be substantially 90 degrees.

Thus, the side surfaces 18B and 18C of the concave part 18 for housing the light emitting device 12 are configured to have perpendicular surfaces made substantially perpendicular to the bottom surface 18A of the concave part 18. This can suppress the diffusion of light emitted from the light emitting apparatus 10. As a result of this, it becomes possible to allow the light emitted from the light emitting apparatus 10 to serve as a point source.

Further, the light emitting device 12 is disposed such that each of the side surfaces 18B and 18C having the perpendicular surfaces is opposed to any one of two long sides of the four sides of the light emitting device 12 which is a rectangle in plan configuration. This can improve the effect of suppressing the diffusion of light emitted upwardly from the light emitting device 12.

When a silicon substrate is used as the base material for the housing main body 14, the <010>planes of the silicon substrate can be utilized for the side surfaces 18B and 18C of the concave part 18, which turns out significantly improving its manufacturing productivity. This is because a method of forming the housing body 14 is directly performed on the silicon substrate, and etching the concave part of the housing body is performed by aligning one pair of the opposing two sides of the opening to have an angle of 45 degree with respect to the <110> plane of the silicon substrate as will be explained later on.

By reference to FIG. 3, the side surface 18D of the concave part 18 is disposed so as to be adjacent to the side surfaces 18B and 18E of the concave part 18. The side surface 18E of the concave part 18 is disposed so as to be adjacent to the side surfaces 18C and 18D of the concave part 18. In other words, the side surfaces 18D and 18E of the concave part 18 are arranged so as to be adjacent to each other.

The side surface 18F of the concave part 18 is disposed so as to be adjacent to the side surfaces 18B and 18G of the concave part 18. The side surface 18G of the concave part 18 is disposed so as to be adjacent to the side surfaces 18C and 18F of the concave part 18. In other words, the side surfaces 18F and 18G of the concave part 18 are arranged so as to be adjacent to each other.

Figure 6:
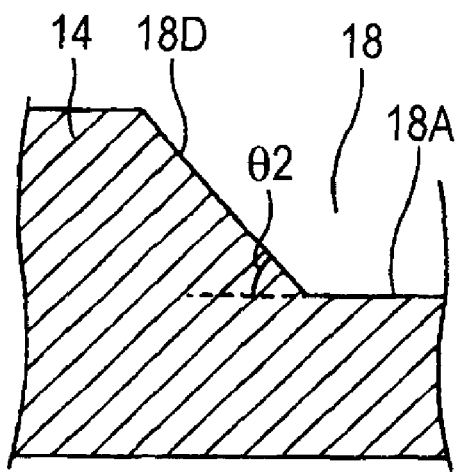
FIG. 6 shows a cross sectional view along line C-C of the light emitting apparatus shown in FIG. 3.

FIG. 6 is a cross sectional view along line C-C of the light emitting apparatus shown in FIG. 3. In FIG. 6, the same constitutional elements as those of the light emitting apparatus 10 shown in FIG. 3 are given the same reference numerals and signs.

By reference to FIG. 6, the side surface 18D of the concave part 18 is configured to have an inclined surface capable of reflecting light emitted from the light emitting device 12 toward above the light emitting device 12. The angle θ2 formed between the side surface 18D and the bottom surface 18A of the concave part 18 can be set to be, for example, 54.7 degrees. The side surfaces 18E to 18G of the concave part 18 are inclined surfaces shaped in the same form as that of the side surface 18D described above.

Thus, the side surfaces 18D to 18G of the concave part 18 for housing the light emitting device 12 are each configured to be an inclined surface capable of reflecting light from the light emitting device 12 toward above the light emitting device 12. This can improve the luminous efficiency of the light emitting apparatus 10.

Further, the side surfaces 18D and 18E of the concave part 18 configured to have incline surfaces are arranged so as to be adjacent to each other. As a result, it makes possible to reflect light with efficiency. This can further improve the luminous efficiency of the light emitting apparatus 10. Whereas, the side surfaces 18F and 18G of the concave part 18 configured to be incline surfaces are arranged so as to be adjacent to each other. This can further improve the luminous efficiency of the light emitting apparatus 10.

When a silicon substrate is used as the base material for the housing main body 14, the <111> plane of the silicon substrate can be utilized for the side surfaces 18D to 18G of the concave part 18, which turns out significantly improving its manufacturing productivity.

This is because a method of forming the housing body 14 is directly performed on the silicon substrate, and etching the concave part of the housing body is performed by aligning one pair of the opposing two sides of the opening to have an angle of 45 degree with respect to the <110>plane of the silicon substrate as will be explained later on.

With the light emitting device housing of this embodiment, the side surfaces 18B and 18C of the concave part 18 for housing the light emitting device 12 are each configured to have a perpendicular surface made substantially perpendicular to the bottom surface 18A of the concave part 18. In addition, the side surfaces 18D to 18G of the concave part 18 are each configured to be an inclined surface capable of reflecting light toward above the light emitting device 12. As a result, it is possible to improve the luminous efficiency of the light emitting apparatus 10, and it is possible to suppress the diffusion of light emitted from the light emitting apparatus 10.

Then, by reference to FIGS. 3 and 4, the via electrodes 15 and 16, and the light emitting device 12 will be described in this order. The via electrode 15 is disposed in the through hole 17A. The upper end portion of the via electrode 15 is electrically connected with a power supply terminal 22 of the light emitting device 12. The lower end portion of the via electrode 15 has a function as an external connection terminal.

The via electrode 16 is disposed in the through hole 17B. The upper end portion of the via electrode 16 is electrically connected with a power supply terminal 23 of the light emitting device 12. The lower end portion of the via electrode 16 has a function as an external connection terminal.

As the material for the via electrodes 15 and 16, for example, Cu can be used. Whereas, when silicon is used as the material for the housing main body 14, an insulation film (not shown) is formed at the portion at which the through holes 17A and 17B are formed of the housing main body 14. This establishes insulation between the housing main body 14 and the via electrodes 15 and 16.

The light emitting device 12 is mounted on the bottom surface 18A of the concave part 18. The light emitting device 12 is an element which emits light from all sides. The light emitting device 12 is a rectangle in plan configuration, and has power supply terminals 22 and 23. The power supply terminal 22 is electrically connected with the via electrode 15 via a wire 25. The power supply terminal 23 is electrically connected with the via electrode 16 via a wire 26.

With the light emitting apparatus of this embodiment, the side surfaces 18B and 18C of the concave part 18 for housing the light emitting device 12 are configured to have perpendicular surfaces made substantially perpendicular to the bottom surface 18A of the concave part 18. In addition, the side surfaces 18D to 18G of the concave part 18 are each configured to be an inclined surface capable of reflecting light toward above the light emitting device 12. As a result, it is possible to improve the luminous efficiency of the light emitting apparatus 10, and it is possible to suppress the diffusion of light emitted from the light emitting apparatus 10.

In this embodiment, a description was given by taking the case where two perpendicular surfaces were provided. More specifically, the side surfaces 18B and 18C of the concave part 18 are each configured to have a perpendicular surface as an example. However, it might be sufficient for achieving the object of the invention even if the perpendicular surface is formed on only one side surface of the side surfaces of the concave part 18. Further, the respective numbers of the perpendicular surfaces and the inclines surfaces formed on the side surfaces of the concave part 18 are not limited to those discussed in the light emitting apparatus 10 of this embodiment.

FIGS. 7 to 14 are diagrams showing the manufacturing process of the light emitting device housing in accordance with the first embodiment of the invention. In FIGS. 7 to 14, as to the same structural elements of the light emitting device housing 11 of the first embodiment, the same reference numerals and signs will be given. Whereas, in FIGS. 7 to 14, E denotes the region in which the light emitting device housing 11 is formed (which is hereinafter referred to as a "light emitting device housing formation region E"), and F denotes the <110> plane of the silicon substrate 31 perpendicular to the <100> plane of the silicon substrate 31.

Figure 7:
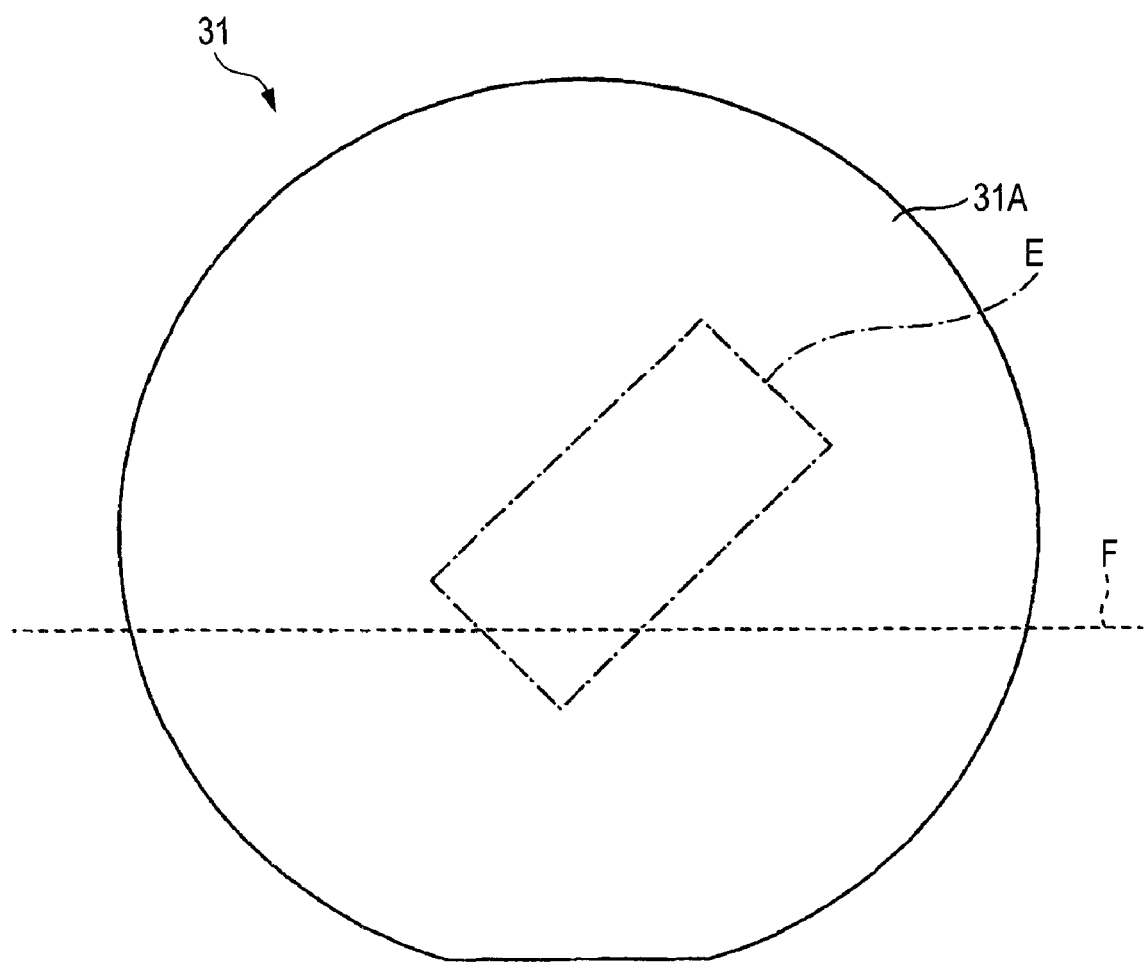
FIG. 7 shows the first explanation view in a manufacturing step of a light emitting device housing in accordance with the first embodiment of the invention.

First, in a step shown in FIG. 7, the silicon substrate 31 in which the top side 31A (fist main side) is a <100> plane is prepared (silicon substrate preparation step).

Figure 8:
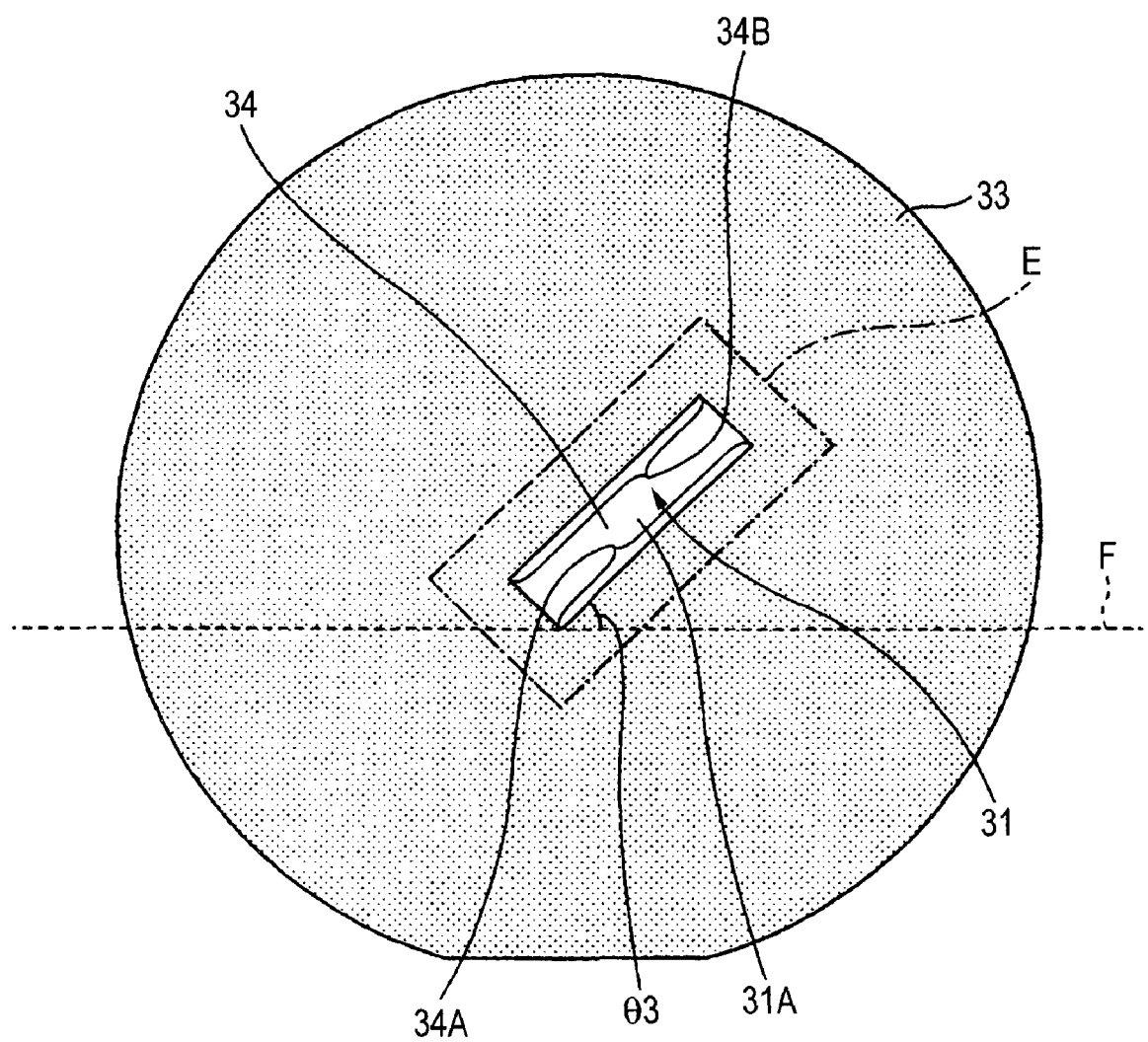
FIG. 8 shows the second explanation view in a manufacturing step of the light emitting device housing in accordance with the first embodiment of the invention.

Then, in a step shown in FIG. 8, on the top side 31A of the silicon substrate 31, a resist film 33 having an opening 34 in a quadrangular shape in plan view is formed (resist film formation step). The opening 34 is formed in the resist film 33 corresponding to the light emitting device housing formation region E. The opening 34 is formed in such a way that any one pair of opposing two sides (e.g. 34A and 34B in FIG. 8) of the opening 34 has an angle of 45 degrees (θ3=45 degrees) with respect to the <110> plane (F shown in FIG. 8) of the silicon substrate 31.

Figure 9:
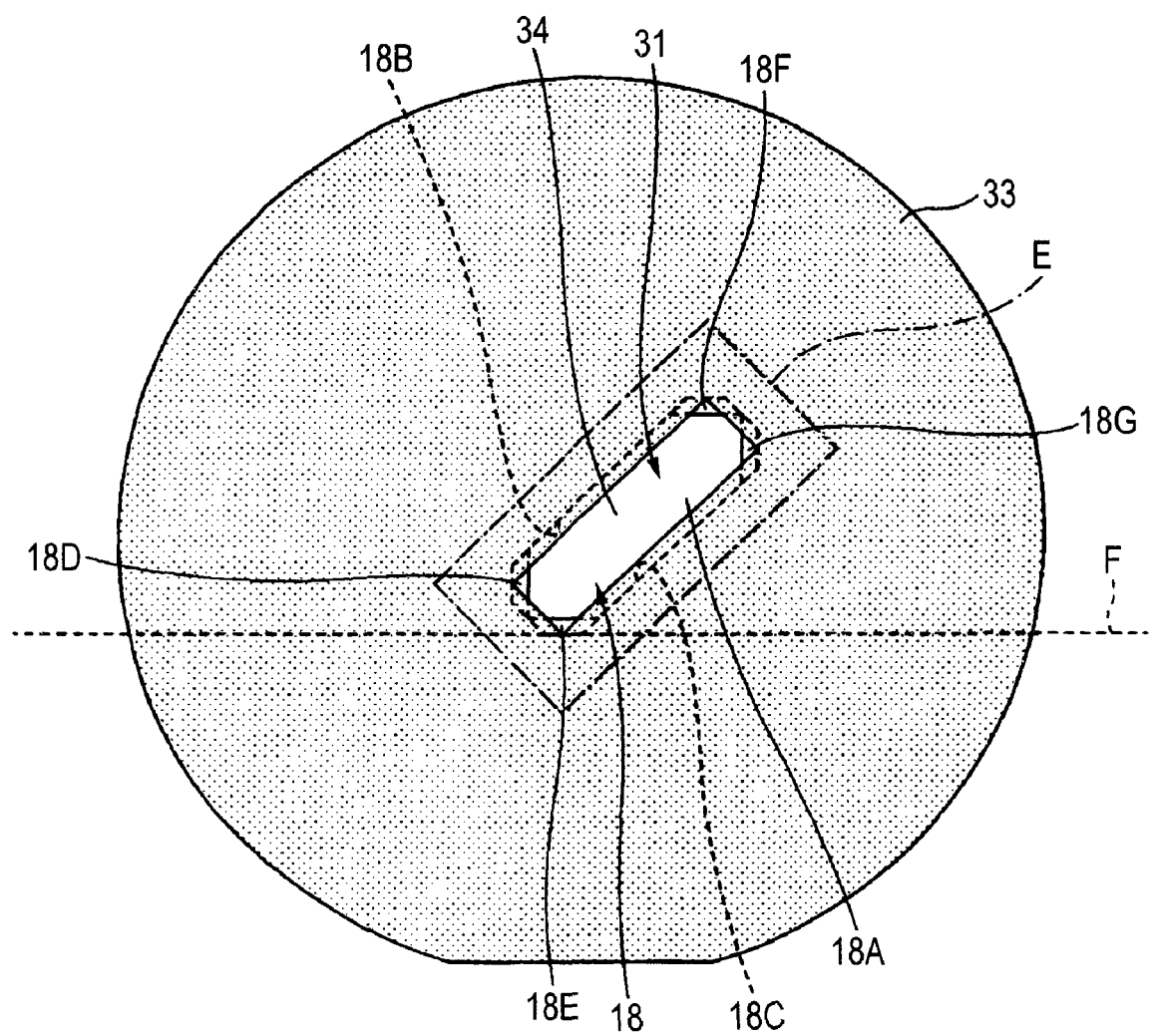
FIG. 9 shows the third explanation view in a manufacturing step of the light emitting device housing in accordance with the first embodiment of the invention.

Then, in a step shown in FIG. 9, the silicon substrate 31 is etched by wet etching using the resist film 33 having the opening 34 as a mask. This forms the concave part 18 including the side surfaces 18B and 18C which are the perpendicular surfaces made substantially perpendicular to the bottom surface 18A of the concave part 18, and the side surfaces 18D to 18G each configured to be an inclined surface reflecting light emitted from the light emitting device 12 toward above the light emitting device 12 (concave part formation step). The side surfaces 18B and 18C of the concave part 18 are the surfaces corresponding to the <010> plane of the silicon substrate 31. On the other hand, the side surfaces 18D to 18G of the concave part 18 are the surfaces corresponding to the <111> plane of the silicon substrate 31.

As explained above, the resist film 33 having the opening 34 is formed in a quadrangular shape, where the top side 31A is aligned to be a <100> plane of the silicon substrate 31. In addition, the opening 34 is formed in such a way that a pair of opposing two sides 34A and 34B has an angle of 45 degrees with respect to the <110> plane of the silicon substrate 31. Then, the silicon substrate 31 is etched by wet etching or anisotropic etching method with using the resist film 33 as a mask. As a result, this makes it possible to readily form the concave part 18 including the side surfaces 18B and 18C made substantially perpendicular to the bottom surface 18A, as well as the side surfaces 18D to 18G each configured to be an inclined surface to reflect the light emitted from the light emitting device 12 upwardly.

This can be realized by utilizing the physical characteristics of the semiconductor wafer, more specifically, the difference of the etching rates between the <010> plane and the <111> plane. That is, since the etching rate is much slower in <010> plane than in <111> plane, it is possible to keep the side surfaces 18B and 18C to be substantially perpendicular to the bottom surface or to the <100> surface due to the time required for revealing the inclined side surfaces 18D to 18G or for the <111> plane, which is relatively shorter than that of being required for revealing the <010> plane.

Figure 10:
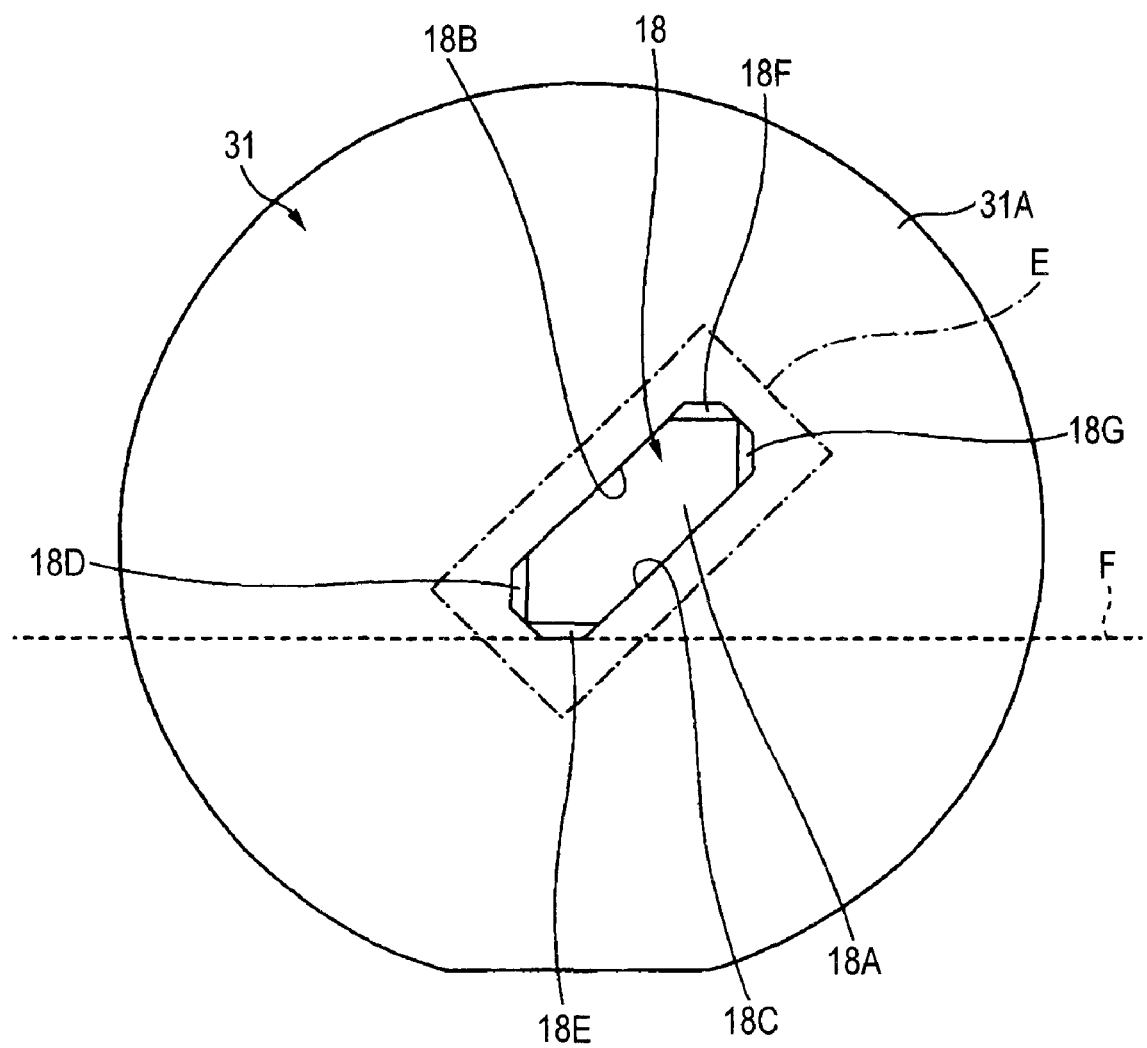
FIG. 10 shows the fourth explanation view in a manufacturing step of the light emitting device housing in accordance with the first embodiment of the invention.
Figure 11:
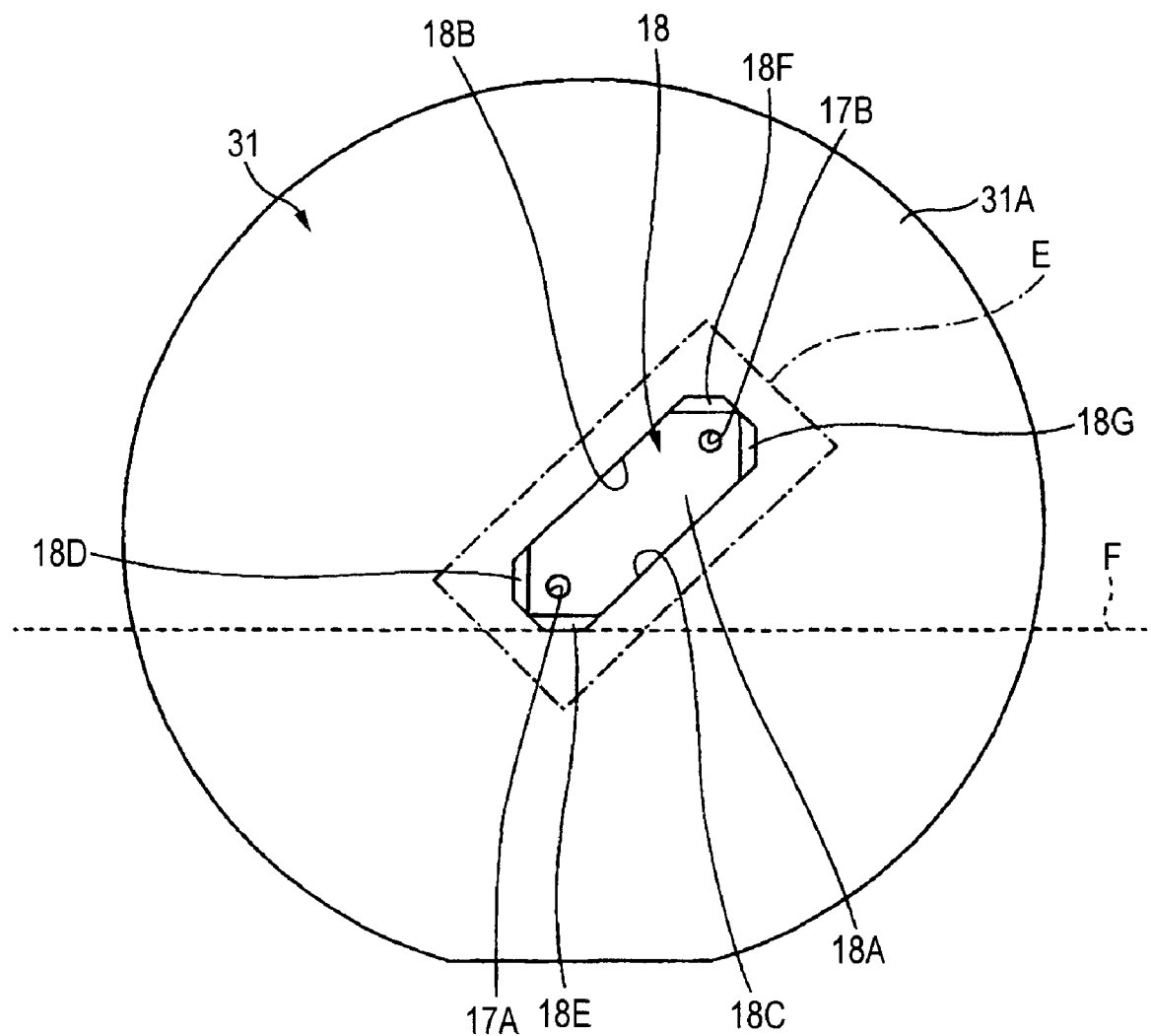
FIG. 11 shows the fifth explanation view in a manufacturing step of the light emitting device housing in accordance with the first embodiment of the invention.

Then, in a step shown in FIG. 10, the resist film 33 is removed. Then, in a step shown in FIG. 11, in the silicon substrate 31 corresponding to the bottom surface 18A of the concave part 18, the through holes 17A and 17B are formed. Specifically, for example, on the structure shown in FIG. 10, a resist film (not shown) having openings corresponding to the positions at which the through holes 17A and 17B are formed is formed. With dry etching using the resist film as a mask, etching is carried out until the silicon substrate 31 is penetrated, thereby to form the through holes 17A and 17B.

Figure 12:
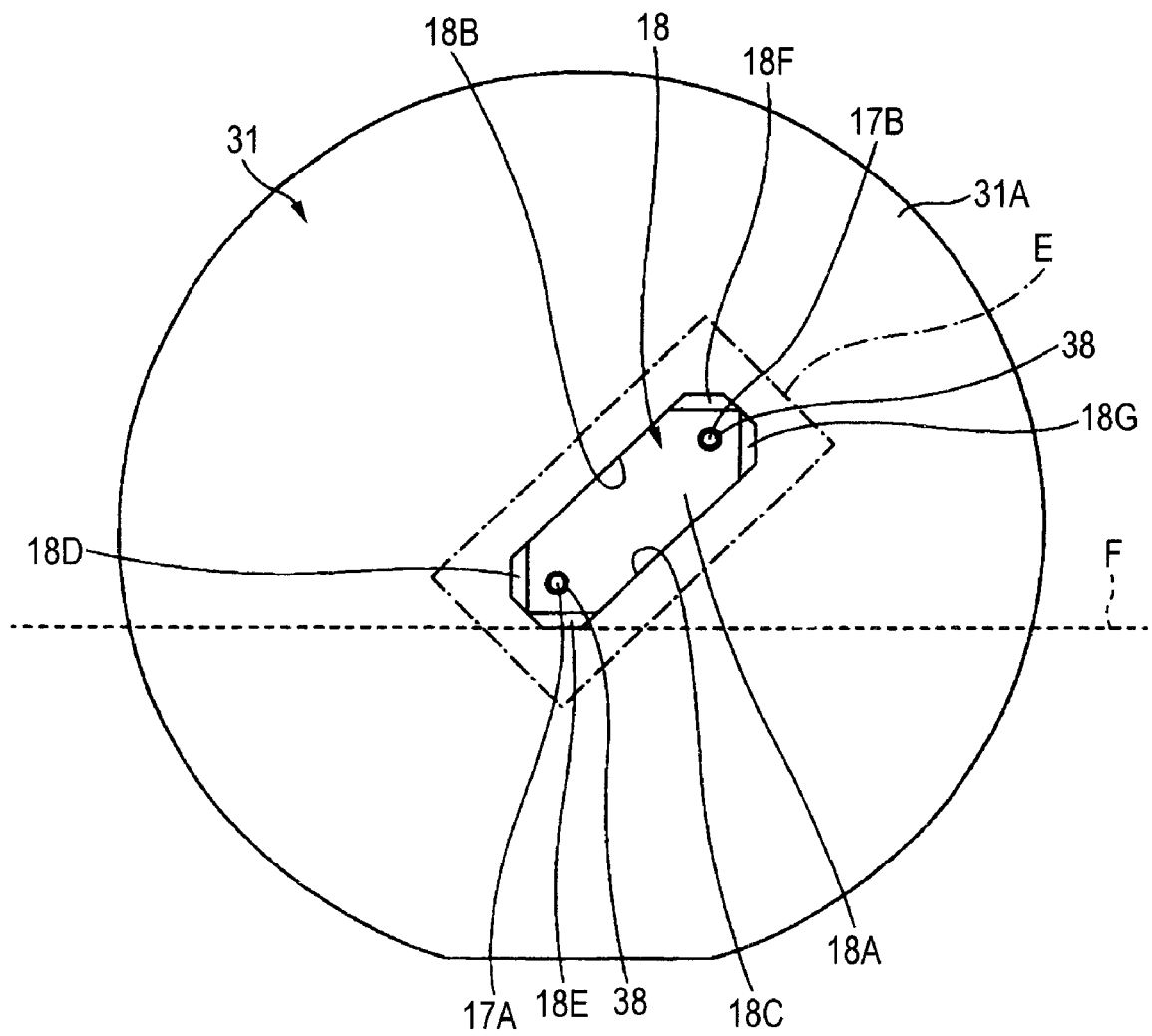
FIG. 12 shows the sixth explanation view in a manufacturing step of the light emitting device housing in accordance with the first embodiment of the invention.

Then, in a step shown in FIG. 12, on each portion of the silicon substrate 31 corresponding to the side surfaces of the through holes 17A and 17B, an insulation film 38 is formed.

Figure 13:
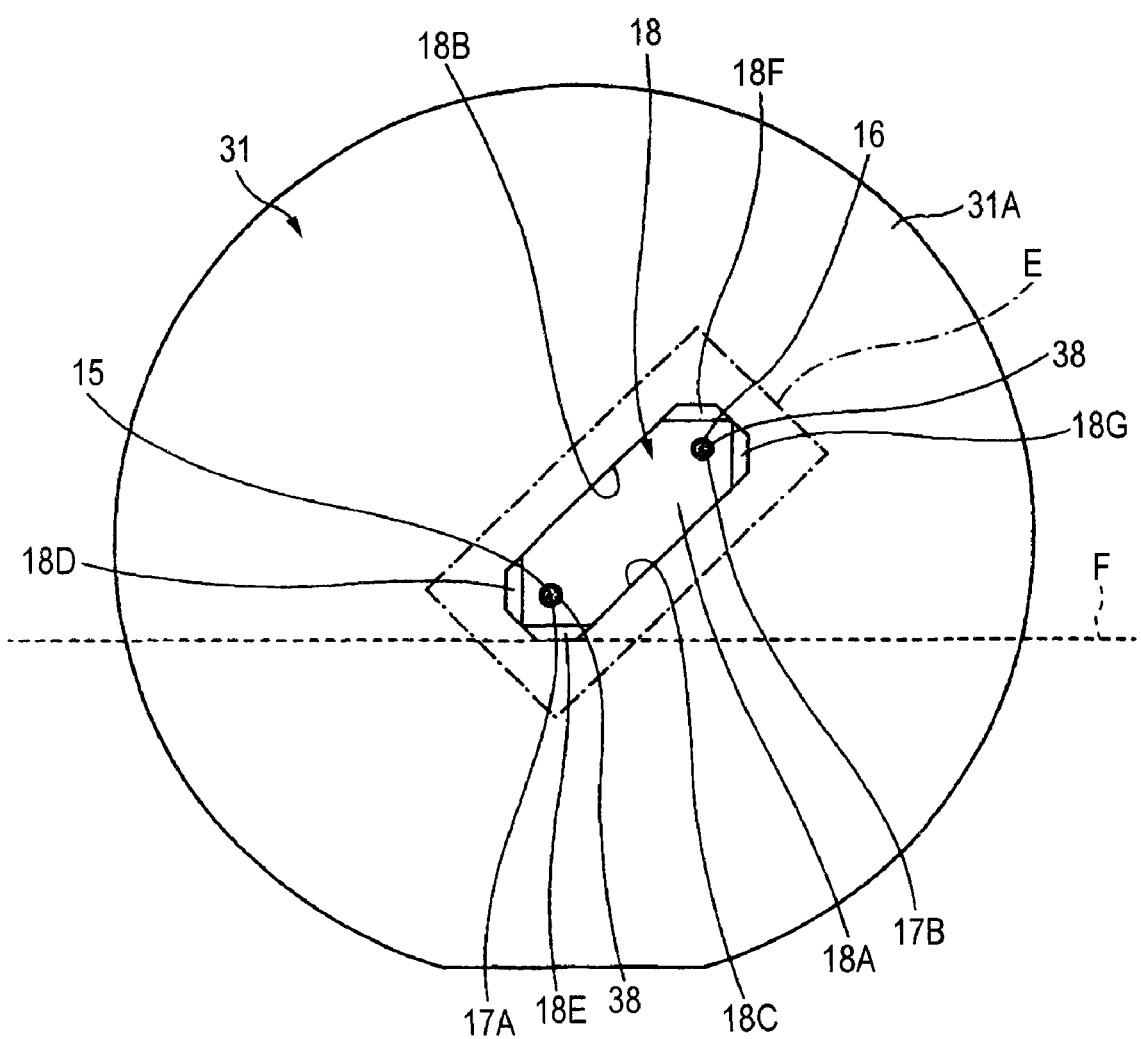
FIG. 13 shows the seventh explanation view in a manufacturing step of the light emitting device housing in accordance with the first embodiment of the invention.

Then, in a step shown in FIG. 13, the via electrodes 15 and 16 are formed in the through holes 17A and 17B each having the insulation film 38 formed thereon, respectively. As a result of this, on a portion of the silicon substrate 31 corresponding to the light emitting device housing formation region E, a structure corresponding to the light emitting device housing 11 is formed.

The via electrodes 15 and 16 can be formed by, for example, a plating method. Whereas, as the material for the via electrodes 15 and 16, for example, Cu can be used.

Figure 14:
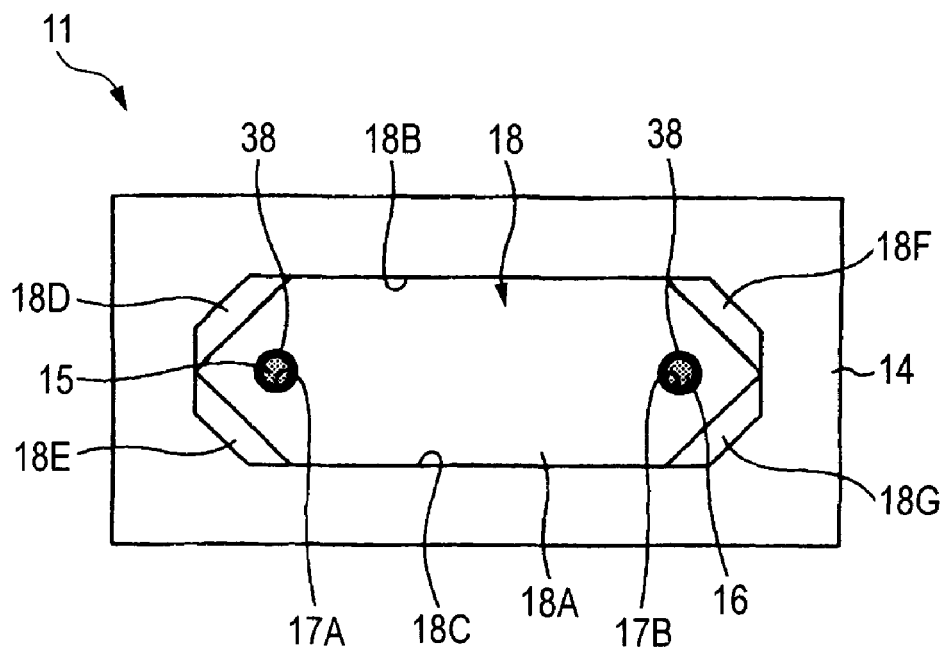
FIG. 14 shows the eighth explanation view in a manufacturing step of the light emitting device housing in accordance with the first embodiment of the invention.

Subsequently, the portion of the silicon substrate 31 corresponding to the light emitting device housing formation region E is cut from the silicon substrate 31. As a result, the light emitting device housing 11 as shown in FIG. 14 is manufactured.

With the manufacturing method of the light emitting device housing of this embodiment, on the top side 31A of the silicon substrate 31 configured to be a <100> plane, the resist film 33 having the opening 34 in a tetragon in plan configuration is formed. In addition, the opening 34 is formed such that any one pair of opposing two sides 34A and 34B of the two pairs of opposing two sides of the tetragon in plan configuration each form an angle of 45 degrees with the <110> plane of the silicon substrate 31. Then, the silicon substrate 31 is etched by wet etching using the resist film 33 as a mask. As a result, it is possible to easily form the concave part 18 including the side surfaces 18B and 18C made substantially perpendicular to the bottom surface 18A, and the side surfaces 18D to 18G each configured to be an inclined surface reflecting light from the light emitting device 12 toward above the light emitting device 12.

Second Embodiment

Figure 15:
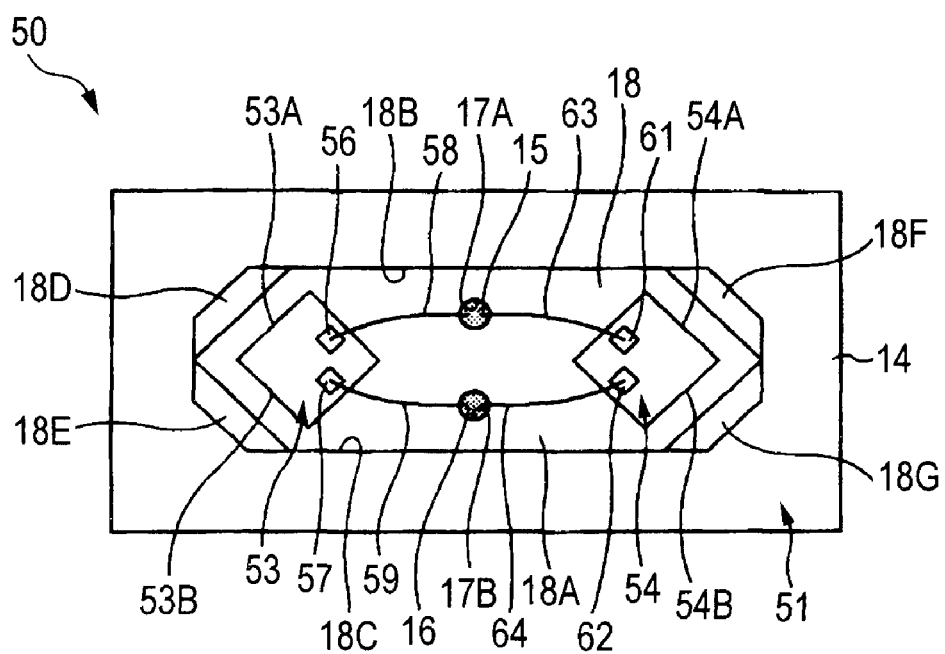
FIG. 15 shows a plan view of a light emitting apparatus in accordance with a second embodiment of the invention.

FIG. 15 is a plan view of a light emitting apparatus in accordance with a second embodiment of the invention. In FIG. 15, the same constitutional elements as those of the light emitting apparatus 10 of the first embodiment are given the same reference numerals and signs.

With reference to FIG. 15, a light emitting apparatus 50 of the second embodiment has a light emitting device housing 51 and light emitting devices 53 and 54. The light emitting device housing 51 is configured similarly with the light emitting device housing 11, except that the through holes 17A and 17B, and the via electrodes 15 and 16 disposed on the light emitting device housing 11 of the first embodiment are disposed in the vicinity of the center of the bottom surface 18A of the concave part 18.

The light emitting device 53 has a substantially square form in plan configuration, and is an element which emits light from all sides.

The light emitting device 53 is provided on the bottom surface 18A of the concave part 18. The light emitting device 53 is arranged such that the side surface 53A of the light emitting device 53 faces the side surface 18D of the concave part 18 configured to be an inclined surface, and such that the side surface 53B of the light emitting device 53 adjacent to the side surface 53A faces the side surface 18E of the concave part 18 configured to be an inclined surface. The light emitting device 53 has power supply terminals 56 and 57. The power supply terminal 56 is electrically connected with the via electrode 15 via a wire 58. The power supply terminal 57 is electrically connected with the via electrode 16 via a wire 59.

The light emitting device 54 has a substantially square form in plan configuration, and is an element which emits light from all sides. The light emitting device 54 is provided on the bottom surface 18A of the concave part 18. The light emitting device 54 is arranged such that the side surface 54A of the light emitting device 54 faces the side surface 18F of the concave part 18 configured to be an inclined surface, and such that the side surface 54B of the light emitting device 54 adjacent to the side surface 54A of the light emitting device 54 faces the side surface 18G of the concave part 18 configured to be an inclined surface. The light emitting device 54 has power supply terminals 61 and 62. The power supply terminal 61 is electrically connected with the via electrode 15 by a wire 63. While, the power supply terminal 62 is electrically connected with the via electrode 16 by a wire 64. Having had this configurations, it is possible to avoid the emitted light from being shielded by the wires.

With the light emitting apparatus of this embodiment, the light emitting devices 53 and 54 are disposed on the bottom surface 18A of the concave part 18 such that the side surfaces 53A, 53B, 54A, and 54B of the light emitting devices 53 and 54 face any one of the side surfaces 18D to 18G of the concave part 18 each configured to be an inclined surface. As a result, it is possible to further improve the luminous efficiency of the light emitting apparatus 50 as compared with the light emitting apparatus 10 of the first embodiment.

Incidentally, the light emitting apparatus 50 of the second embodiment with the foregoing configuration can provide the same effects as with the light emitting apparatus 10 of the first embodiment. Whereas, the light emitting device housing 51 described in this embodiment can be manufactured with the same procedures as with the light emitting device housing 11 described in the first embodiment. Further, a description was given by taking, as an example, the case where the two light emitting devices 53 and 54 were mounted on the concave part 18 of the light emitting device housing 51. However, it is also acceptable that three or more light emitting devices are provided on the bottom surface 18A of the concave part 18.

Up to this point, the preferred embodiments of the invention were described in details. However, the invention is not limited to such specific embodiments, and various modifications/changes are possible within the scope of the gist of the invention described in the appended claims.

The present invention is applicable to a light emitting device housing for use in spotlight, headlight of a car, or the like, and a manufacturing method thereof, and a light emitting apparatus.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. A light emitting device housing including a concave part that receives a light emitting device, comprising:
    a single silicon substrate comprising the concave part formed therein that has a bottom surface that a plurality of side surfaces surround, said side surfaces of the single silicon substrate including:
        first and second side surfaces that are substantially perpendicular to the bottom surface of the concave part, said first side surface being disposed on a first side of said light emitting device while said second side surface is disposed on a second side of said light emitting device, and wherein said first side surface faces toward said second side surface and is spaced a distance from said second side surface, and
        a plurality of inclined side surfaces that are disposed at ends of the first and second side surfaces so as to extend between said first and second side surfaces, said inclined side surfaces extending upwardly from a lower end intersecting said bottom surface and serving to upwardly reflect light from the light emitting device, the plurality of inclined surfaces comprising first and second pairs of inclined surfaces, and the first pair of inclined surfaces being adjacent each other and the second pair of inclined surfaces being adjacent each other,
    wherein via electrodes are formed through the bottom surface of the concave part, and the via electrodes are electrically connected to the light emitting device.

2. The light emitting device housing according to claim 1, wherein the light emitting device has a rectangle shape, and the light emitting device is disposed such that each of the long sides thereof faces an adjacent one of the first and second side surfaces the light emitting device housing.

3. The light emitting device housing according to claim 1, wherein the light emitting device has a rectangle shape, and the light emitting device is disposed such that each of the long sides thereof faces an adjacent one of the first and second side surfaces of the light emitting device housing.

4. The light emitting device housing according to claim 1, wherein the light emitting device has a quadrangular shape, and the light emitting device is disposed such that each of the long sides thereof faces an adjacent one of the first and second side surfaces of the light emitting device housing.

5. The light emitting device housing according to claim 1, wherein the light emitting device has a quadrangular shape, and the light emitting device is disposed such that each of the long sides thereof faces an adjacent one of the first and second side surfaces of the light emitting device housing.

6. The light emitting device housing according to claim 1, wherein the first and second side surfaces are surfaces corresponding to <010 >planes of the single silicon substrate and the inclined side surfaces are surfaces corresponding to planes of the single silicon substrate.

7. A light emitting apparatus, comprising:
    a light emitting device that is provided in the light emitting device housing, wherein
    said light emitting device housing comprises a single silicon substrate having a concave part formed therein with a plurality of side surfaces, said plurality of side surfaces comprising:
        first and second side surfaces among the plurality of the side surfaces having a perpendicular surface so as to be substantially perpendicular to a bottom surface of the concave part, said first surface being on a side of said light emitting device opposite to said second surface and being oriented such that said first and second side surface face one another; and
        a plurality of inclined side surfaces, said plurality of inclined side surfaces being disposed on ends of said first and second side surfaces and serving to interconnect said ends of said first and second side surfaces, wherein the plurality of inclined surfaces upwardly reflect light from the light emitting device,
    wherein via electrodes are formed through the bottom surface of the concave part, and the via electrodes are electrically connected to the light emitting device.

8. The light emitting apparatus according to claim 7, wherein the first and second side surfaces are surfaces corresponding to planes of the single silicon substrate and the inclined side surfaces are surfaces corresponding to planes of the single silicon substrate.

9. The light emitting apparatus according to claim 7, wherein the plurality of inclined surfaces comprise first and second pairs of inclined surfaces, and the first pair of inclined surfaces are adjacent each other and the second pair of inclined surfaces are adjacent each other.

* * * * *